(12) United States Patent
Hsieh

(10) Patent No.: US 8,431,425 B2
(45) Date of Patent: Apr. 30, 2013

(54) METHOD FOR FABRICATING IMAGE SENSOR WITH UNIFORM PHOTOSENSITIZING SENSITIVITY

(75) Inventor: Cheng-Yu Hsieh, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/469,369

(22) Filed: May 11, 2012

(65) Prior Publication Data

US 2012/0225516 A1 Sep. 6, 2012

Related U.S. Application Data

(63) Continuation of application No. 12/548,670, filed on Aug. 27, 2009, now Pat. No. 8,198,119.

(51) Int. Cl.
*H01L 21/00* (2006.01)

(52) U.S. Cl.
USPC .............. 438/29; 438/69; 438/70; 438/151; 257/98; 257/184; 257/431; 257/E31.127

(58) Field of Classification Search ............ 257/98, 257/184, 431–432, E21.211; 438/69–70, 438/75, 151, 321; 359/652, 665, 741, 796, 359/666
See application file for complete search history.

(56) References Cited

U.S. PATENT DOCUMENTS

| 7,068,432 | B2 | 6/2006 | Boettiger et al. |
| 7,196,388 | B2 | 3/2007 | Wu |
| 7,280,278 | B2 | 10/2007 | Boettiger et al. |
| 7,280,279 | B2 | 10/2007 | Boettiger et al. |
| 7,297,473 | B2 | 11/2007 | Ono et al. |
| 7,297,916 | B1 | 11/2007 | Feng |
| 7,307,788 | B2 | 12/2007 | Boettiger et al. |
| 7,385,766 | B2 | 6/2008 | Ohtake |
| 7,897,986 | B2 | 3/2011 | Liu et al. |
| 2003/0020971 | A1* | 1/2003 | Kwon ........................ 358/514 |

(Continued)

FOREIGN PATENT DOCUMENTS

JP 2006235084 * 9/2006

OTHER PUBLICATIONS

Audran et, al., "Study of dynamical formation and shape of microlenses formed by the reflow method", 2006, vol. 6153, Proc. of SPIE.

(Continued)

*Primary Examiner* — Evan Pert
*Assistant Examiner* — Mark A Laurenzi
(74) *Attorney, Agent, or Firm* — Ding Yu Tan

(57) ABSTRACT

A method for fabricating an image sensor is provided. A substrate is provided, and then a plurality of photoresist patterns is formed on the substrate. The photoresist patterns are arranged in a first array and defined by a plurality of photomask patterns arranged as a photomask pattern array, wherein a top view of each photoresist pattern has a substantially square shape and a distance between two neighboring photoresist patterns decreases from a center of the first array toward an edge of the first array. Besides, each photomask pattern includes a transparent portion and an opaque portion, wherein an area proportion of the transparent portion included in a photomask pattern increases from the center toward the edge of the photomask pattern array. Then, a thermal reflow step is performed to convert the photoresist patterns into a plurality of microlenses arranged in a second array.

7 Claims, 5 Drawing Sheets

U.S. PATENT DOCUMENTS

| | | | | |
|---|---|---|---|---|
| 2006/0256442 | A1* | 11/2006 | Hasei | 359/619 |
| 2007/0284510 | A1* | 12/2007 | Li et al. | 250/208.1 |
| 2009/0174945 | A1 | 7/2009 | Lin et al. | |
| 2009/0261439 | A1* | 10/2009 | Liu et al. | 257/432 |

OTHER PUBLICATIONS

Baillie et, al., "Zero-space microlenses for CMOS image sensors: optical modeling and lithographic process development", 2004, pp. 953-959, vol. 5377, Proceedings of SPIE.

Lee et, al., "The Fabrication Process and Characteristics of Light Loss Free Zero-Space Microlenses for CMOS Image Sensor", 2005, pp. 1241-1248, vol. 5754, Proceedings of SPIE.

Nam et, al., "The Optimization of Zero-Spaced Microlenses for 2.2um Pixel CMOS Image Sensor", 2007, vol. 6520, Proc. Of SPIE.

O'Neill et, al., "Photoresist reflow method of microlens production Part II: Analytic models", 2002, Optik Optics International Journal of Light and Electron Optics.

Jerome Vaillant et, al., "Optical simulation for CMOS imager microlens optimization", 2004, pp. 200-210, vol. 5459, Proceedings of SPIE.

* cited by examiner ant features and advantages of the present invention comprehensible, a preferred embodiment accompanied with figures is described in detail below.

METHOD FOR FABRICATING IMAGE SENSOR WITH UNIFORM PHOTOSENSITIZING SENSITIVITY

CROSS-REFERENCE TO RELATED APPLICATIONS

This application is a continuation application of U.S. patent application Ser. No. 12/548,670 filed on Aug. 27, 2009.

BACKGROUND OF THE INVENTION

1. Field of Invention

This invention relates to a method for fabricating an image sensor, wherein the image sensor is applied in an electronic image recording apparatus.

2. Description of Related Art

Electronic image recording apparatuses, such as charge-coupled device (CCD) image recording apparatuses and complementary metal oxide semiconductor (CMOS) image recording apparatuses, have been widely used for image recording. As shown in FIG. 1A, the core of such an image recording apparatus typically includes an image sensor chip 10 and lenses 12 disposed thereover. The sensor chip 10 is formed with photosensitizing devices (not shown) like CCDs or photodiodes. The lenses 12 are fit in a lens barrel 14. The incident light 16 irradiates the chip 10 through the lenses 12.

The chip 10 is schematically illustrated in FIG. 1B in a magnified view, having a photosensitizing plane 110 defined by the photosensitizing devices and an interconnect dielectric layer 120. To improve the sensitivity of the photosensitizing devices, a planarization layer 130 and microlenses 140 with focusing capability are usually formed over the interconnect dielectric layer 120.

However, as shown in FIGS. 1A-1B, since the incident angle of the central incident light 16a is zero, the incident angle of non-central incident light 16b increases toward the edge of the chip 10 and the curvatures and the focal lengths of the respective microlenses 140 are the same, the distance between the focus position of the incident light 16b and the photosensitizing plane 110 increases toward the edge of the chip 10. Thus, the sensitivity of the photosensitizing device decreases toward the chip edge, which is a cause of the distortion in image recording.

SUMMARY OF THE INVENTION

Accordingly, this invention provides a method for fabricating an image sensor to solve the problem of non-uniform sensitivity of the photosensitizing devices.

The method for fabricating an image sensor of this invention is described below. A substrate is provided, and then a plurality of photoresist patterns is formed on the substrate. The photoresist patterns are arranged in a first array, wherein a top view of each photoresist pattern has a substantially square shape and a distance between two neighboring photoresist patterns decreases from a center of the first array toward an edge of the first array. Then, a thermal reflow step is performed to convert the photoresist patterns into a plurality of microlenses arranged in a second array.

The focal length of microlenses increases from the center of the array toward the edge of the array. Thus, all incident lights from the array center to the array edge can be focused at the photosensitizing plane, so that the sensitivity of the photosensitizing devices is uniformized.

In order to make the aforementioned and other objects, features and advantages of the present invention comprehensible, a preferred embodiment accompanied with figures is described in detail below.

DESCRIPTION OF EMBODIMENTS

This invention is further explained with the following first to third embodiments, which are however not intended to restrict the scope of this invention. For example, the first sub-patterns and/or the second sub-patterns of a photoresist pattern for forming a chessboard-type microlens may have shapes other than those shown in FIGS. 8A-8B.

Figure 1A:
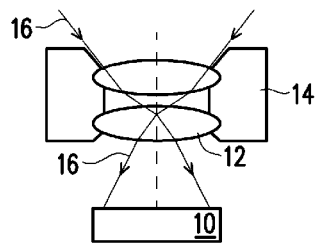
FIG. 1A illustrates the arrangement of the image sensor chip, the lenses and the lens barrel in an electronic image sensor in the prior art, and FIG. 1B schematically illustrates a magnified view of the image sensor chip.
Figure 1B:
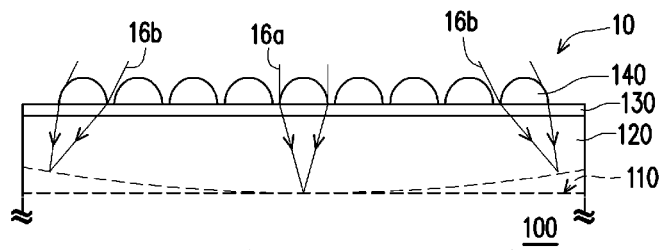
Figure 2:
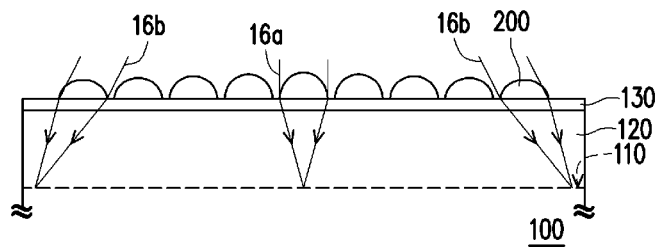
FIG. 2 schematically illustrates the microlens array formed in a second case of a first embodiment and the paths of the incident lights at the array center and the array edge respectively.

FIG. 2 schematically illustrates the microlens array formed in the second case of the first embodiment and the paths of the incident lights at the array center and the array edge respectively. The microlens array formed in the first embodiment can be called a cushion-type microlens array, which is characterized in that each microlens therein has different curvatures between the X or Y direction and the diagonal direction.

As shown in FIG. 2, in the second case of the first embodiment, the height of the microlens 200 decreases from the array center toward the array edge, and the curvature of the same also decreases from the array center toward the array edge, so that the focal length of the same increases from the array center toward the array edge. Since the incident angle of the incident light increases from the array center toward the array edge (16b>16a), all incident light passing the microlenses 200 from the array center to the array edge can be focused at the photosensitizing plane 110.

Figure 3:
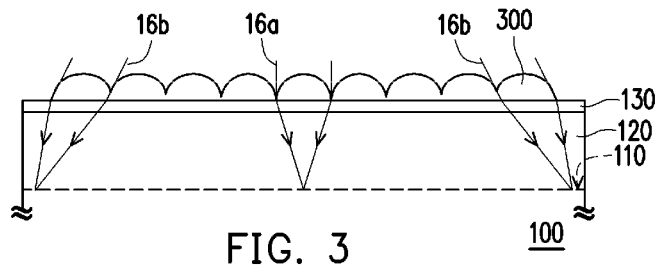
FIG. 3 schematically illustrates the microlens array formed in a second embodiment and the paths of the incident lights at the array center and the array edge respectively.

FIG. 3 schematically illustrates the microlens array formed in the second embodiment and the paths of the incident lights at the array center and the array edge respectively. The microlens array formed in the second embodiment can be called a continuous-type microlens array, as described in U.S. patent application Ser. No. 11/970,936 filed on Jan. 8, 2008, being characterized in that any two neighboring microlenses therein are connected with each other and each microlens has substantially the same curvature in the vertical cross-sectional views of all directions. Any two neighboring photoresist patterns among the photoresist patterns as the precursor of the continuous-type microlenses are connected with or close to each other, so that any two neighboring microlenses are connected with each other.

As shown in FIG. 3, any two neighboring microlenses 300 are connected with each other. The heights of the microlenses 300 are substantially the same, but the curvature of the same decreases from the array center toward the array edge, so that the focal length of the same increases from the array center toward the array edge. Since the incident angle of the incident light increases from the array center toward the array edge (16b>16a), all incident light passing the microlenses 300 from the array center to the array edge can be focused at the photosensitizing plane 110.

In the first embodiment of this invention concerning the cushion-type microlens array, microlenses are formed by reflowing a plurality of separate photoresist patterns previously formed on the planarization layer. The top view of each photoresist pattern has a substantially square shape, so that each microlens has different curvatures in the X or Y direction and the diagonal direction.

Figure 4A:
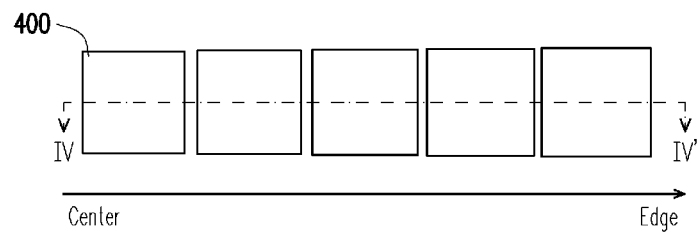
FIG. 4A schematically illustrates the photoresist pattern array as the precursor of the microlens array in a first case of the first embodiment of this invention, and FIG. 4B illustrate the IV-IV' cross sections of the photoresist patterns in FIG. 4A and the vertical cross sections of the microlenses formed through the thermal reflow step.
Figure 4B:
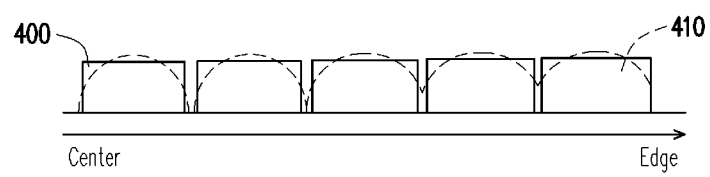

Referring to FIG. 4A and the IV-IV' cross-sectional view in FIG. 4B, in the first case of the first embodiment, all the photoresist patterns 400 with a substantially square shape in the top view have the same height, but the area thereof increases from the array center to the array edge, so that the distance between two neighboring photoresist patterns 400 decreases from the array center to the array edge. Because the photoresist patterns 400 have the same height and the area thereof increases from the array center to the array edge, the microlenses 410 formed from the photoresist patterns 400 have the same height, and the curvature thereof decreases from the array center toward the array edge so that the focal length thereof increases from the array center toward the edge. Since the incident angle of the incident light also increases from the array center toward the array edge, all incident light passing the microlenses 410 from the array center to the array edge can be focused at the photosensitizing plane. Moreover, for the distance between two neighboring photoresist patterns 400 decreases from the array center to the array edge 110, any two neighboring microlenses 410 apart from the array center by a distance larger than a certain value are connected with each other, and the thickness of the connection part gradually increases toward the array edge.

Figure 5A:
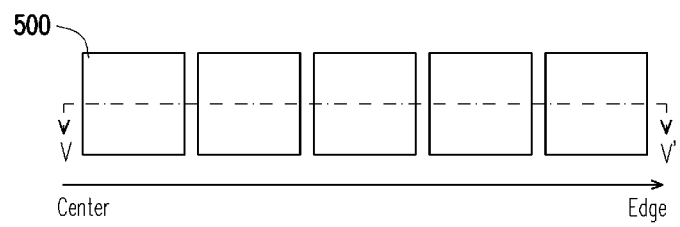
FIG. 5A schematically illustrates the photoresist pattern array as the precursor of the microlens array in the second case of the first embodiment of this invention, and FIG. 5B illustrate the V-V' cross sections of the photoresist patterns in FIG. 4A and the vertical cross sections of the microlenses formed through the thermal reflow step.
Figure 5B:
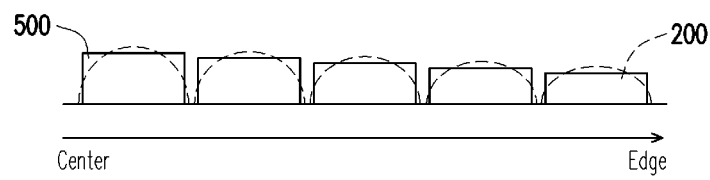

Referring to FIG. 5A and the V-V' cross-sectional view in FIG. 5B, in the second case of the first embodiment, all the photoresist patterns 500 have the same area, but the height thereof decreases from the array center to the array edge, so that the height and the curvature of the microlenses 200 formed from the photoresist patterns 500 decrease from the array center toward the array edge and the focal length increases from the array center toward the array edge.

In the second case of the first embodiment, the height decrease of the photoresist patterns 500 from the array center toward the array edge may be achieved by increasing the transparency of the photomask patterns defining the photoresist patterns 500 from the array center toward the array edge. The transparency increase may be achieved by including a transparent portion and an opaque portion in each photomask pattern and making the area proportion of the transparent portion in the photomask pattern increases from the array center toward the array edge. The area proportion of the transparent portion in a photomask pattern may be varied with the methods shown in FIGS. 6A-6B.

Figure 6A:
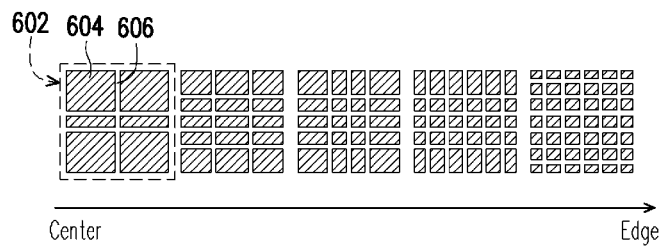
FIGS. 6A and 6B schematically illustrate the top views of two examples of the photomask pattern array defining the microlens array in the second case of the first embodiment of this invention.

Referring to FIG. 6A, each photomask pattern 602 includes an opaque portion 604 constituted of a plurality of block opaque regions, and a transparent portion 606 constituted of a plurality of transparent line regions between the block opaque regions. The number of the transparent line regions of the photomask patterns 602 increases from the array center toward the edge, so that the area proportion of the transparent portion 606 in the photomask pattern 602 increases from the array center toward the array edge and the transparency of the photomask pattern 602 increases from the array center toward the array edge.

Figure 6B:
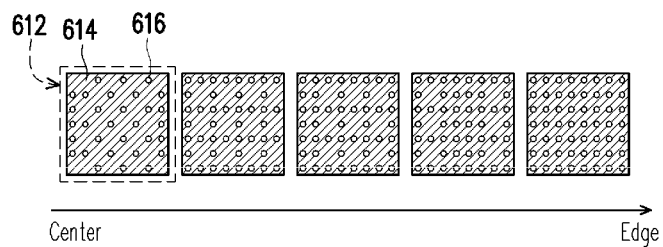

Referring to FIG. 6B, each photomask pattern 612 includes an opaque portion 614, and a transparent portion 616 constituted of a plurality of transparent dot regions in the opaque portion 614. The number of the transparent dot regions in the photomask patterns 612 increases from the array center toward the edge, so that the area proportion of the transparent portion 616 in the photomask pattern 612 increases from the array center toward the edge and the transparency of the photomask pattern 612 increases from the array center toward the array edge.

On the other hand, in the second embodiment of this invention concerning the continuous-type microlens array, the photomask pattern for defining a microlens may have a transparency distribution where the transparency increases from the center of the photomask pattern toward the edge of the same. Such a transparency distribution may be made by disposing certain concentric transparent scattering rings. Three examples of the photomask patterns with transparent scattering rings are shown in FIGS. 7A-7B.

Figure 7A:
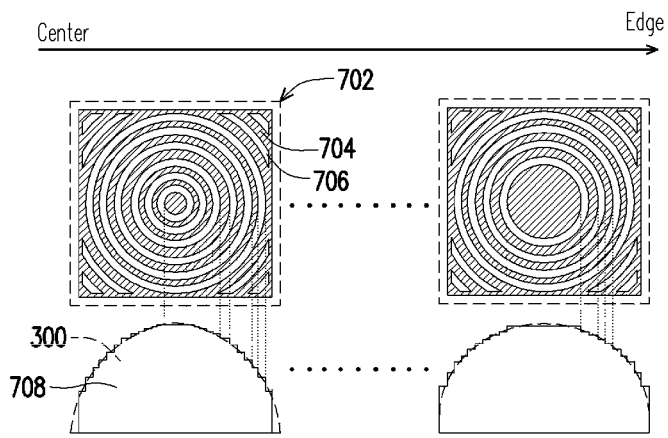
FIGS. 7A, 7B and 7C schematically illustrate the top views of the photomask patterns defining a central microlens and an edge microlens respectively according to three examples of the second embodiment of this invention.

Referring to FIG. 7A, as compared to the edge photomask pattern 702, the central photomask pattern 702 additionally has two smaller transparent scattering rings 706, while the widths of the opaque portion 704 between the common transparent scattering rings 706 of them are substantially the same, so that the transparency increase rate from the center of the edge photomask pattern 702 toward the edge of the same is lower than that from the center of the central photomask pattern 702 toward the edge of the same. Hence, as compared with the case of the central photomask pattern 702, the center-to-edge height difference of the photoresist pattern 708 defined by the edge photomask pattern 702 is smaller, so that the curvature of the corresponding microlens 300 is smaller. The variation of the curvature of the microlenses 300 from the array center to the array edge can be controlled by adjusting the number and widths of the additional smaller transparent scattering rings 706.

Figure 7B:
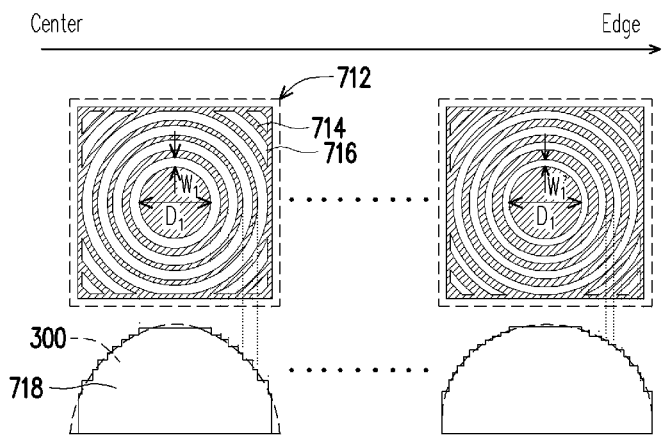

Referring to FIG. 7B, the central opaque portions 714 of the photomask patterns 712 from the array center to the array edge have the same diameter $D_1$, while the width of the transparent scattering rings 716 decreases from the array center to the array edge ($W_1'<W_1$) and the width of the annular opaque portions 714 between the scattering rings 716 increases from the array center to the edge. Thereby, the closer a photomask pattern 712 is to the array edge, the lower the transparency increase rate from its center to its edge. Thus, the self center-to-edge height difference of the photomask pattern 718 decreases from the array center to the edge, so that the curvature of the microlenses 300 formed from the photoresist patterns 718 by thermal reflow decreases from the array center to the edge. Meanwhile, the height of the connection portion between two neighboring photomask patterns 718 increases from the array center to the array edge.

Figure 7C:
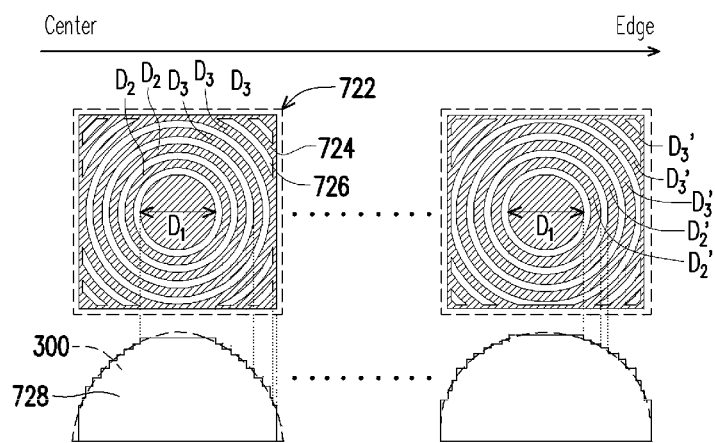

Referring to FIG. 7C, the central opaque portions 724 of the photomask patterns 722 from the array center to the array edge have the same diameter $D_1$ and the widths of the transparent scattering rings 726 are not varied, but the width of the annular opaque portions 724 between the scattering rings 726 increases from the array center to the edge ($D_2'>D_2$, $D_3'>D_3$). Thereby, the closer a photomask pattern 722 is to the array edge, the lower the transparency increase rate from its center to edge. Thus, the self center-to-edge height difference of the photomask pattern 728 decreases from the array center to the array edge, so that the curvature of the microlenses 300 formed from the photoresist patterns 728 by thermal reflow decreases from the array center to the edge. Meanwhile, the height of the connection portion between two neighboring photomask patterns 728 increases from the array center to the array edge.

Figure 8A:
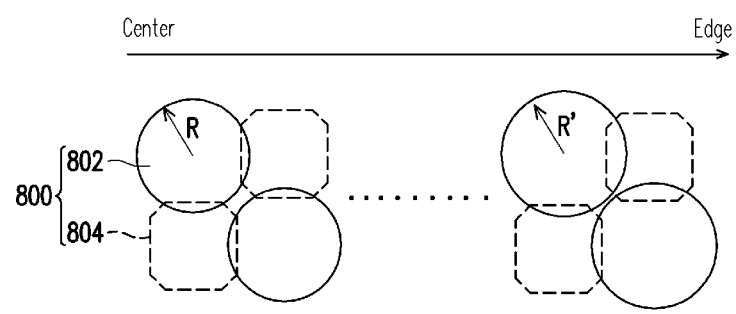
FIGS. 8A and 8B schematically illustrate the variations of the photoresist patterns as the precursor of the microlenses from the array center toward the edge according to two examples of a third embodiment of this invention.
Figure 8B:
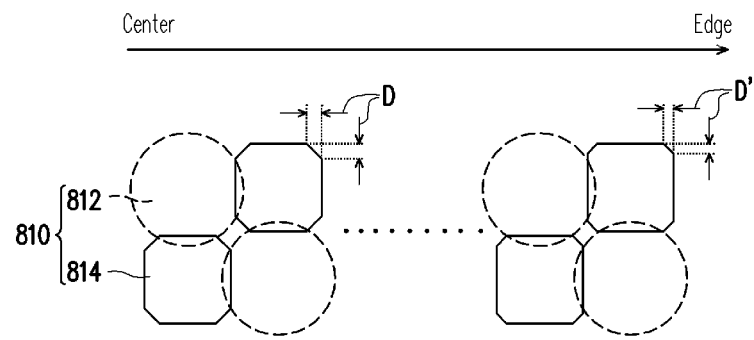

FIGS. 8A and 8B schematically illustrate the variations of the photoresist patterns as the precursor of the microlenses from the array center toward the edge according to two examples of the third embodiment of this invention. The microlens formed in this embodiment can be called a chessboard-type microlens, which typically includes two first sub-microlenses arranged diagonally and two second sub-microlenses arranged diagonally. The shapes of the first and the second sub-microlenses before the thermal reflow, i.e., the shapes of the first and second sub-photoresist patterns as the precursors of the first and the second sub-microlenses, are different in the top view.

To make all incident light passing the microlenses from the array center to the array edge be focused at the photosensitizing plane, the focal length of such chessboard-type have to be increased from the array center to the edge. This may be achieved by increasing the area of the first or second sub-photoresist pattern from the array center to the array edge.

Referring to FIG. 8A, a photoresist pattern 800 as the precursor of a chessboard-type microlens includes two first sub-patterns 802 arranged diagonally and two second sub-patterns 804 arranged diagonally. The first sub-patterns 802 are formed in a first lithography process, the second sub-patterns 804 are formed in a second lithography process, and the first sub-patterns 802 overlap with the second sub-patterns 804. In the top view, a first sub-pattern 802 has a substantially circular shape, and a second sub-patterns 804 substantially has an octangular shape corresponding to a square shape that is cut at four corners thereof.

In the example of FIG. 8A, the focal length of the chessboard-type microlenses is increased from the array center to the array edge in the following manner. The center-to-center distance between the two first sub-patterns 802 and that between the two second sub-patterns 804 in any photoresist pattern 800 are fixed. Meanwhile, the radius of the substantially circular first sub-pattern 802 is increased from the array center to the array edge ($R'>R$), so that the area of the first sub-pattern 802 increases from the array center to the array edge.

In the example of FIG. 8B, the focal length of the chessboard-type microlenses is increased from the array center to the array edge in the following manner. The center-to-center distance between the two first sub-patterns 812 and that between the two second sub-patterns 814 in any photoresist pattern 810 are fixed. Meanwhile, the area of the cut corners of the square shape corresponding to the second sub-pattern 814 is decreased from the array center to the array edge ($2D'^2<2D^2$), so that the area of the second sub-pattern 814 increases from the array center to the array edge.

Since the focal length of the microlenses formed in this invention increases from the center to the edge of the image sensor while the incident angle of the incident light increases from the center to the edge of the image sensor, all incident light from the center to the edge of the image sensor can be focused at the photosensitizing plane. Thus, the sensitivity of the photosensitizing devices can be uniformized, so that the distortion in image recording can be reduced as compared to the prior art.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of fabricating an image sensor, comprising:

providing a substrate of the image sensor;

defining on the substrate a plurality of photoresist patterns arranged in a first array by a plurality of photomask patterns arranged as a photomask pattern array, wherein a top view of each photoresist pattern has a substantially square shape and a distance between two neighboring photoresist patterns decreases from a center of the first array toward an edge of the first array, and each photomask pattern includes a transparent portion and an opaque portion, wherein an area proportion of the transparent portion included in the photomask pattern increases from the center of the photomask pattern array toward the edge of the photomask pattern array; and performing a thermal reflow step to convert the photoresist patterns into a plurality of microlenses arranged in a second array.

2. The method of claim 1, wherein a height of the photoresist pattern decreases from the center of the first array toward an edge of the first array.

3. The method of claim 1, wherein the transparent portion includes a plurality of transparent line regions.

4. The method of claim 1, wherein the transparent portion includes a plurality of transparent dot regions.

5. The method of claim 1, wherein the image sensor is a CMOS image sensor or a CCD image sensor.

6. The method of claim 1, wherein curvature of the microlens decreases from a center of the second array toward an edge of the second array.

7. The method of claim 1, wherein area of the photoresist pattern increases from the center of the first array toward the edge of the first array.

* * * * *